US006803570B1

(12) United States Patent
Bryson, III et al.

(10) Patent No.: US 6,803,570 B1
(45) Date of Patent: Oct. 12, 2004

(54) ELECTRON TRANSMISSIVE WINDOW USABLE WITH HIGH PRESSURE ELECTRON SPECTROMETRY

(75) Inventors: Charles E. Bryson, III, 19270 Quinn Ct., Morgan Hill, CA (US) 95037; Frank J. Grunthaner, Glendale, CA (US); Paula J. Grunthaner, Glendale, CA (US)

(73) Assignee: Charles E. Bryson, III, Morgan Hill, CA (US)

( * ) Notice: Subject to any disclaimer, the term of this patent is extended or adjusted under 35 U.S.C. 154(b) by 0 days.

(21) Appl. No.: 10/618,078

(22) Filed: Jul. 11, 2003

(51) Int. Cl.[7] .......................... H01J 37/252; H01J 33/04

(52) U.S. Cl. ........................ 250/305; 250/306; 250/310; 250/505.1; 313/420

(58) Field of Search ................................. 250/305, 306, 250/310, 441.11, 505.1; 313/420

(56) References Cited

U.S. PATENT DOCUMENTS

| | | | | | |
|---|---|---|---|---|---|
| 5,391,958 | A | * | 2/1995 | Kelly | 313/420 |
| 6,002,202 | A | * | 12/1999 | Meyer et al. | 313/420 |
| 6,452,177 | B1 | * | 9/2002 | Feldman et al. | 250/310 |
| 2004/0061051 | A1 | * | 4/2004 | Schneiker et al. | 250/306 |

OTHER PUBLICATIONS

L. E. Trimble et al., "Membrane fragility: fact or illusion?", *J. Vac. Sci. Technol. B,* vol. 10, No. 6, Nov./Dec. 1992, 3200–3203 pp.

T. Kramer et al., "Postbuckled micromachined square membranes under differential pressure", *Journal of Micromechanics and Microengineering* vol. 12, 2002, 475–478 pp.

N. J. Lanno et al., "Measurement of the permeability of thin films", *Review of Scientific Instruments*, vol. 70, No. 4, Apr. 1999, 2072–2073 pp.

Jinling Yang et al., "Fracture properties of LPCVD silicon nitride thin films from the load–deflection of long membranes", *Sensors and Actuators A,* vol. 97, No. 98, 2002, 520–526 pp.

D. Maier–Schneider, "A new analytical solution for the load–deflection of square membranes", *Journal of Microelectromechanical Systems*, vol. 4, No. 4, Dec. 1995, 238–241 pp.

* cited by examiner

*Primary Examiner*—Jack I. Berman
(74) *Attorney, Agent, or Firm*—Charles S. Guenzer

(57) ABSTRACT

A vacuum window transmitting keV electrons and usable for high-pressure electron analysis such as XPS and AES in which the sample is positioned outside the UHV analyzer chamber, possibly in a controlled gas environment, relatively close to the window. The window includes a grid formed from a support layer and a thin window layer supported between the ribs and having a thickness preferably of 2 to 3 nm. The window and support layers may be deposited on a silicon wafer and the support layer is lithographically defined into the grid. The wafer is backside etched to expose the back of the grid and its supported window layer. Such a window enables compact and easily used electron analyzers and further allows control of the gas environment at the sample surface during analysis.

20 Claims, 7 Drawing Sheets

ELECTRON TRANSMISSIVE WINDOW USABLE WITH HIGH PRESSURE ELECTRON SPECTROMETRY

BACKGROUND OF THE INVENTION

1. Field of the Invention

The invention relates generally to materials characterization equipment. In particular, the invention relates to electron analyzers of material probed by x-rays or electrons.

2. Background Art

Several types of analysis equipment have found widespread use in the characterization of materials, particularly near the material surface, by measuring the spectrum of relatively low-energy electrons emitted from the probed material, that is, electron spectroscopy of secondary electrons produced by probing radiation and thereafter emitted from the sample. In particular, such equipment is capable of determining the composition and electronic bonding structure of the surface material.

One such type of equipment involves x-ray photoelectron spectroscopy (XPS) in which keV x-rays irradiate the sample to produce electrons, more specifically photoelectrons, of somewhat lower energy, which are ejected from the sample and spectrally analyzed. Another type of equipment involves auger electron spectroscopy (AES) in which probe electrons in the keV to 10 keV energy range irradiate the sample to produce secondary electrons, more specifically Auger electrons, in the 100 eV to few keV energy range, which are emitted and spectrally analyzed.

Both types of equipment require determining the energy and intensity (flux) of keV electrons. However, such low-energy electrons are subject to very strong scattering by any matter between the probed sample and the electron analyzer. Particularly for AES but also for XPS, even the probing radiation is subject to strong scattering and absorption. As a result, conventional analysis equipment of this type has enclosed the probe source, the sample, and the detector in a high-vacuum chamber, for example held at $10^{-8}$ Torr or less (1 Torr equals 133 Pa), commonly referred to as ultra-high vacuum (UHV), although $10^{-6}$ Torr will be considered as the maximum pressure for an electron analyzer in some configurations. In particular, it has been considered infeasible to use a vacuum window to pass the low-energy radiation, particularly the electrons, between the sample and the detector so that the sample must be inserted into the same UHV chamber required for the low-energy electron optics and detector. As a result, conventional XPS and AES equipment has been characterized as being very large, weighing on the order of tons, and not amenable to remote operation. Nonetheless, the need has arisen for the use of such equipment for planetary exploration, for example, to probe the chemistry of the Martian landscape. XPS and AES provide the needed analysis, but at the present time the instrumentation is too large and heavy for applications in space.

Furthermore, various needs exist for electron spectroscopy of samples held in a gaseous environment at moderate pressures rather than at the UHV pressure required with conventional XPS and AES systems. First, even disregarding the weight issue, simulation of Martian chemistry and testing of satellite equipment on earth would benefit from performing the test analysis in a simulated Martian environment, which is dominated by $CO_2$ and $N_2$ but with little $O_2$ and very little water, a completely different environment than Earth's and undoubtedly resulting in a vastly different chemistry. Secondly, analysis of biological samples at UHV is suspect because there is always a question whether previously living tissue or organisms radically alter when exposed to UHV. In particular, most organisms and tissue exist in an aqueous environment, but water evaporates at room temperature at pressures of 20 Torr and less. It would be greatly advantageous to perform the spectroscopy with samples exposed to a 20 Torr room-temperature ambient or even at 15° C. and a 10 Torr pressure. Thirdly, there is great interest to investigate gas-phase catalysis to determine the chemistry of reactions between a gas and a solid catalyst. Clearly, UHV pressures are not consistent with reasonable concentrations of the gas phase to be measured. Fourthly, it would be beneficial to directly study the chemistry of chemical vapor deposition (CVD) commonly used in the semiconductor industry, in which precursor gases react with and deposit reaction products on a substrate such as silicon wafer, thereby growing on the substrate a thin film of a material derived from the precursor. Many types of CVD are performed at moderate pressures of a few hundred milliTorr to tens of Torr. Accordingly, surface analysis performed at these pressures could directly measure the CVD process.

Recently x-ray sources have been developed which are vastly smaller and lighter than conventional x-ray guns. They are commercially available from Moxtek of Orem, Utah, Amptek of Bedford, Massachusetts, and Oxford Instruments. These compact sources have diameters of a few millimeters and include a thin transmissive or an obliquely aligned reflective metal target irradiated by electrons with energy of tens of keV to generate the desired x-rays. However, such small sources do not address the rest of the problem of heavy vacuum interlocks.

An electron window has recently been proposed for such high pressure electron spectroscopy. The window includes a number of thin walls with small apertures through them, which together with electron focusing permits electrons to travel from a higher pressure environment containing the sample to the UHV electron analyzer. Such equipment, however, has been very heavy and restricted to research environments.

SUMMARY OF THE INVENTION

An thin layer of window of thickness between 1 and 5 nm, more preferably between 2 and 3 nm, allows electrons having energy near a keV to pass therethrough with acceptable attenuation. The window layer is supported on a grid of much thicker ribs with the window layer extending in the apertures between the ribs to thereby provide mechanical strength to stand off the pressure difference.

An electron transmissive window may be formed by semiconductor processing techniques in which a window layer and a support layer are deposited on a substrate such as a silicon wafer or wafer chip. The support layer is photolithographically etched to form the ribs in the window area. The silicon wafer is photolithgraphically etched on it backside to form a window aperture surrounding the window area. The silicon wafer outside the window aperture may be used as a support. Deposition techniques include chemical vapor deposition, atomic layer deposition, sputtering, and for some materials oxidation, such as thermal oxidation.

Materials for the support and window layers include silicon oxide and silicon nitride, but other materials are possible.

In one embodiment, the window layer is deposited or otherwise formed over the substrate, and the support layer is deposited over the window layer. The support layer is etched selectively to the underlying window layer to form the grid. The substrate is backside etched selectively to the window layer.

In another embodiment, the support layer is formed over the substrate and photolithographically defined into the grid. The window layer is conformally or nearly conformally deposited over the ribs of the grid and the portions of the substrate exposed between the ribs. The substrate is backside etched selectively to the window layer. Preferably, a curved skirt portion of the window layer is formed in the corners of the ribs next to the then existing substrate.

A gas cell including an electron vacuum window may be fully inserted into a high-vacuum electron analyzer with an enclosed test sample but with a selected internal gas environment at a finite pressure significantly higher than the high vacuum. A sample stub with an electron vacuum window may project into the high-vacuum electron analyzer and allow a sample to be inserted to the area of the window from outside the analyzer. An electron vacuum window may be disposed on an exterior surface of the high-vacuum analyzer to allow manual placement of the sample next to the window. A simple vacuum enclosure may be placed over the sample and pumped to a medium vacuum or flooded with a controlled gas environment.

DETAILED DESCRIPTION OF THE PREFERRED EMBODIMENTS

Because electrons interact with a gas or solid through which they pass and therefore are scattered, electron flux as a function of distance from the electron source follows a negative exponential dependence normalized to the mean free path. Over a path of a mean free length, the electron flux is attenuated to 1/e of its original flux. As a result, an electron-based analyzer can position the sample being tested in an environment having a moderate pressure if three conditions are met. First, the ultra-high vacuum accommodating the electron analyzer should be separated from the sample by an ultra-thin vacuum window or member having a thickness not significantly greater than the mean free path of the electron in the window material. Secondly, the window must nonetheless afford sufficient strength to withstand the pressure differential and sufficient solidity and impermeability to prevent significant gaseous diffusion through the window. Thirdly, the sample must be positioned sufficiently close to the window that the gas within the sample environment does not completely absorb the electrons of keV or lower energy before they reach the window. The electron mean free path in gases decreases inversely with the pressure.

Gas pressure in the Martian environment is about 7 Torr versus the 760 Torr of Earth's atmosphere. At 7 Torr, the mean free path for keV electrons is about 0.2 mm. A separation of 1 mm would attenuate the flux to about 1%, a low but still usable flux. The inelastic mean free path for electrons at two energies of interest is presented in TABLE 1 for aluminum, copper, and gold.

TABLE 1

| Electron Energy | Mean Free Path (nm) | | |
|---|---|---|---|
| (eV) | Al | Cu | Au |
| 500 | 1.2 | 1.0 | 0.7 |
| 1500 | 2.9 | 2.4 | 1.8 |

Values for materials based on silicon would be close to those for aluminum, and those for materials based on carbon, oxygen, and nitrogen would be greater by a factor of about 1.5 to 2. As a result, an exemplary window thickness would be about 2 nm. Films of such thickness can be grown by techniques developed in the semiconductor industry and have sufficiently low porosity to block the diffusion of gases through it. However, a free-standing window of such small thicknesses has insufficient strength to stand off the pressure differential across a significantly sized window.

Although electron spectrometry has been performed at low energies of 200 eV and even lower, the data in the above table suggests that electron vacuum windows are difficult to implement to pass such low-energy electrons. As a result, a lower energy limit of 400 eV or 500 eV is realistic. An upper energy limit is suggested by the electron energy needed to excite k-alpha x-rays in the sample, which is about 1500 eV in aluminum. For secondary electrons above this energy, analysis becomes difficult.

Figure 1:
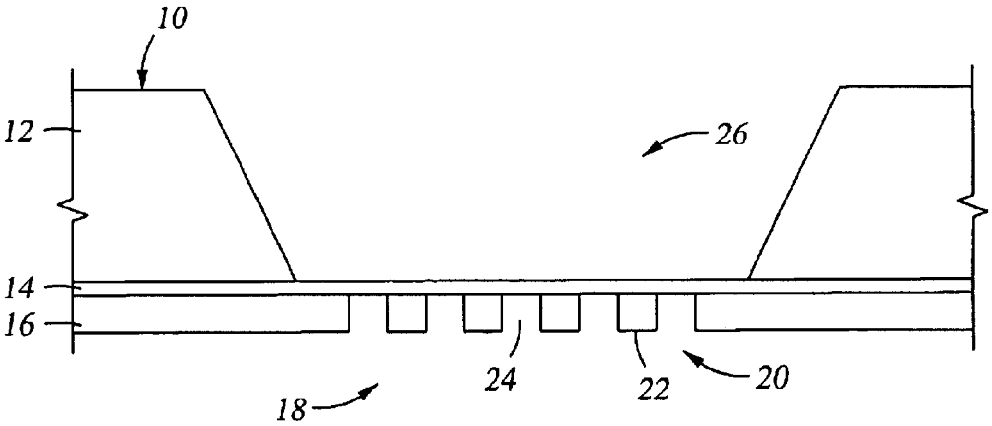
FIG. 1 is cross-sectional view of one embodiment of an electron vacuum window of the invention.
Figure 2:
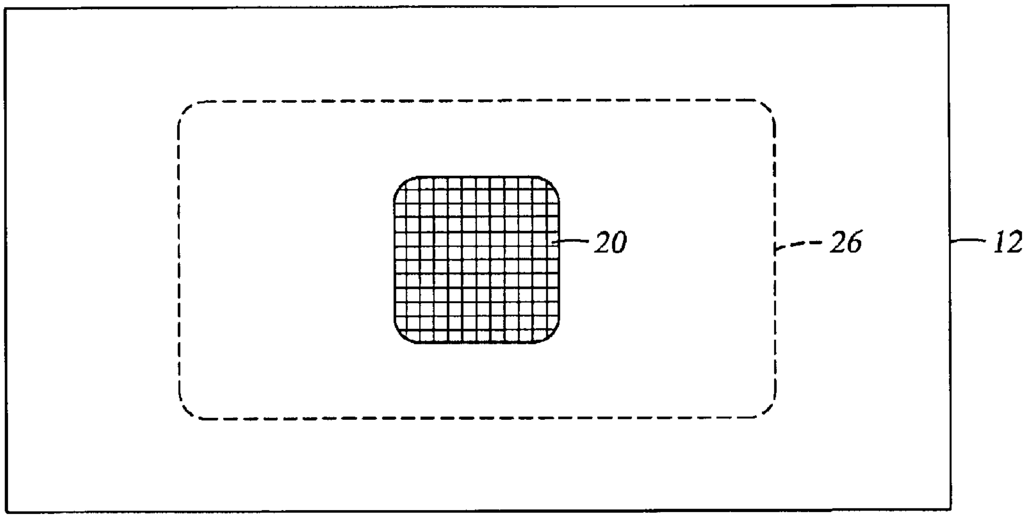
FIG. 2 is a bottom plan view of the window of FIG. 1 taken along view line 2—2.

Nonetheless, one embodiment of a satisfactory window 10, illustrated schematically in FIG. 1, can be fabricated using conventional techniques. It includes a surrounding support structure 12 formed from a fairly conventional silicon wafer chip 12, that is, one having a thickness of about 0.25 mm and being substantially monocrystalline as used in the semiconductor integrated circuit industry. An ultra-thin window layer 14 is formed deposited on the unpatterned wafer 12 to a thickness of between 1 and 5 nm although the minimum thickness may be increased to 2 nm or the maximum thickness decreased to 3 nm. A support layer 16 is deposited on the support film to a thickness of between about 0.4 to 5 $\mu$m, more preferably about 0.5 to 2 $\mu$m. A window area 18 of the support layer 16 having a size of about 2 cm on a side, although the size can be varied between 2 mm and 5 cm, is patterned to form a rectangular grid 20, shown in bottom plan view in FIG. 2, of perpendicularly arranged ribs 22 separating grid apertures 24 through the support film 14. Alternatively, the ribs 22 may be arranged in a non-rectangular grid enclosing apertures 24 in a close-packed hexagonal structure. The ribs 22 preferably have a width of at least 0.5 μm but a width of greater than 3 μm would unduly reduce the transparency of the window. The grid apertures 24 may number about 600 in each direction (a total of 360,000) and be spaced at periods of about 5 μm. The individual apertures 24 preferably have sizes of about between about 2 to 20 μm on a side, more preferably more than 5 μm.

After the films 14, 16 have been deposited and the support film 16 has been patterned to form the grid 20, the backside of the silicon wafer chip 12 is selectively etched to form a window aperture 26 in back of the window area 18 of size of about 2 cm. Although the illustrated grid 20 and window aperture 26 are approximately square, they may have other shapes including circular and oval. In particular, the transparency of the window 10 to probing radiation directed at an oblique angle through the window 10 is increased if the grid apertures 24 have distinctly rectangular or oblate shapes with the long direction being aligned with the direction of incident radiation. Taking this into account, the grid apertures 24 can be arranged on a period in the short direction of the apertures 24 of between 1 and 10 μm, preferably about 3 to 7 μm, but the period in the long direction can by much greater.

The material compositions of the two layers 14, 16 are not fundamentally limited, and both layers 14, 16 may have the same composition if suitable patterning is available. The support layer 16 may be composed of multiple layers, for example, to have different layers tailored for mechanical strength and adhesion. The semiconductor industry has developed many effective deposition and etching techniques for silicon oxide and silicon nitride, and both materials form in a strong amorphous or glassy state. Following the trends of TABLE 1, silicon oxide and nitride both exhibit reasonably long mean free paths for electrons. Silicon oxide, often simply called oxide, typically has a composition close to $SiO_2$ and may have other constituents in forming silica or other silicate glass. Silicon nitride, often simply called nitride, has a nominal composition of $Si_3N_4$, but other non-stoichiometric compositions of $SiN_x$, where $1<x<1.6$, are experienced in practice. Although other configurations are possible, a preferred structure includes the window layer 14 being formed of silicon oxide and the support layer 16 being formed of silicon nitride. Boron nitride has many advantages, but the technology of depositing it to form thin and ultra-thin films and etching those films is not well developed.

Figure 3:
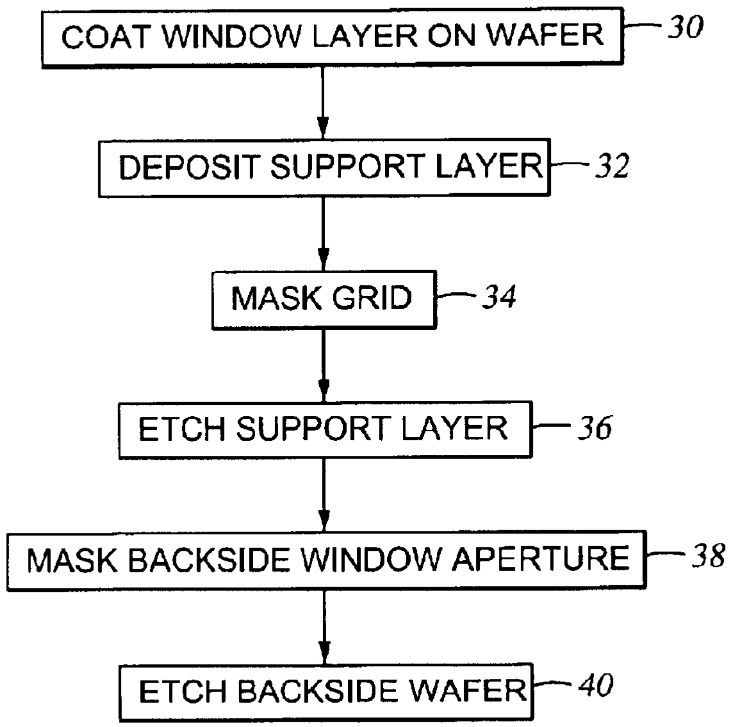
FIG. 3 is a flow diagram of a process for fabricating the window of FIGS. 1 and 2.

A fabrication process for the structure of FIG. 1 is illustrated in the flow diagram of FIG. 3. In step 30, the planar window layer 14 is coated on the wafer 12. The deposition process may include sputtering, thermal CVD, or plasma CVD, as commonly practiced in the semiconductor industry. Very thin layers of compounds such as silicon oxide and silicon nitride can be controllably grown by atomic layer deposition (ALD), which is a form of CVD in which compound materials are grown a fractional atomic layer at a time. If the window layer 14 is silicon oxide, it can be thermally grown from the silicon wafer, as is well developed for gate oxides in integrated circuits. In step 32, the planar support layer 16 is deposited on the window layer 14. In step 34, a grid photomask is applied over the support layer 16 and patterned to define the grid 22. In step 36, the support layer 16 is etched through the photomask, preferably anisotropically and selectively to the underlying window layer 14. In step 38, a window photomask is deposited on the backside of the wafer 12 and patterned to define the window aperture 26. In step 40, the silicon wafer 12 is etched through the window photomask and selectively to the thin window layer 14. For an oxide window layer 14, the etch may be an isotropic wet KOH etch. For such an isotropic etch, the photomask should have a smaller aperture than the intended window aperture 26 since the isotropic etch undercuts the mask.

As in the fabrication of integrated circuits, multiple windows 10 can be simultaneously fabricated on a same wafer 12. The dicing of the wafer 12 into chips each containing a window 10 may be performed after the backside etching if care is exercised in protecting the fragile window.

Figure 4:
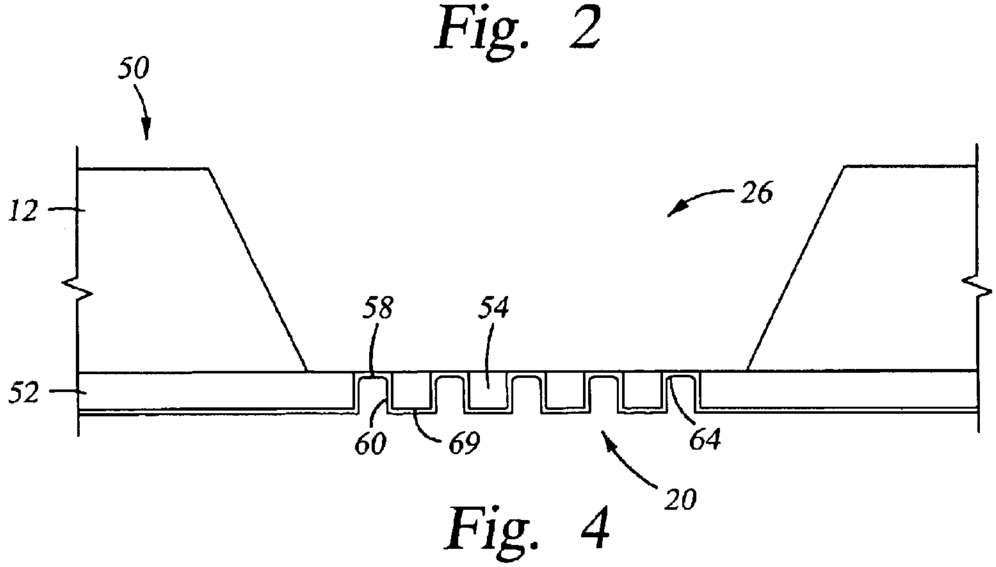
FIG. 4 is a cross-sectional view a second embodiment of an electron vacuum window of the invention.

An alternative structure for an electron vacuum window 50 is illustrated in cross section in FIG. 4. A support layer 52 is coated on the silicon wafer 12 and patterned to form ribs 54 of the grid 20. At this point, the ribs 54 are supported on the as yet unpatterned front surface of the wafer 12. A nearly conformal window layer 56 is deposited over the patterned support layer 52 to form thin window portions 58 over the silicon wafer 12 between the ribs 54. Sidewall portions 60 and front portions 62 of the window layer 56 formed on the sides and front surface of the ribs 54 are relatively unimportant. However, it is advantageous that the coating be only nearly conformal such that curved skirt portions 64 of the window layer 56 be formed in the bottom comers between the window and sidewall portions 58, 60. Trimble et al. in "Membrane fragility: Fact or illusion," *Journal of Vacuum Science and Technology B*, vol. 10, no. 6, November/December 1992, pp. 3200–3203 have explained how such skirts increase the mechanical strength of thin films.

Figure 5:
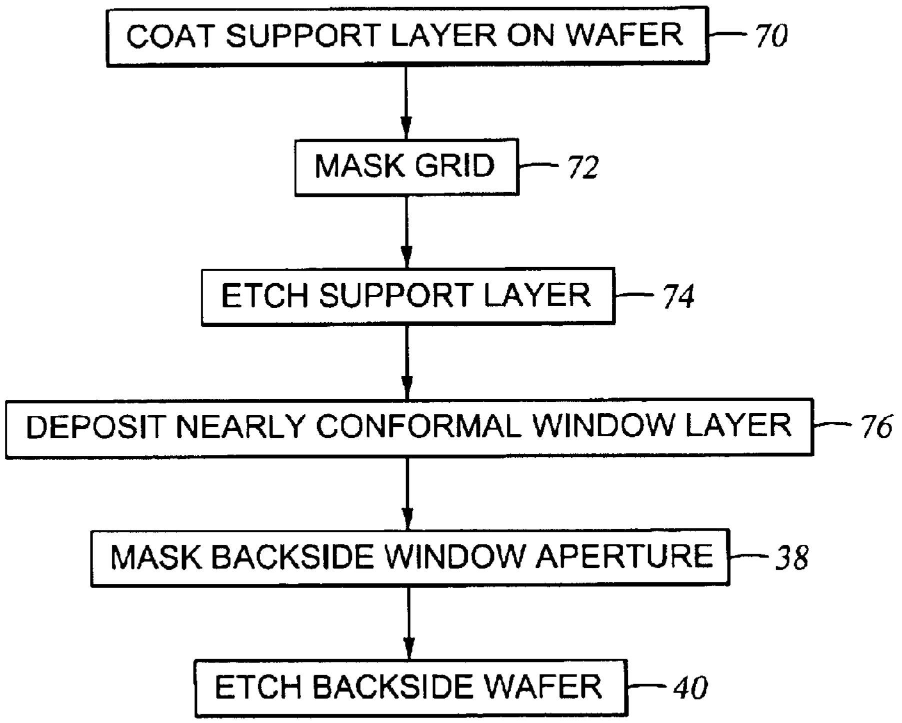
FIG. 5 is a flow diagram of a process for fabricating the window of FIG. 4.

The process for forming such a window 50 is illustrated in the flow diagram of FIG. 5.

In step 70, the support layer 52 is coated on the wafer 12. In step 72, a grid photomask is deposited and defined over the support layer 52. In step 74, the support layer 52 is etched, preferably anisotropically and selectively to the underlying silicon wafer 12. However, selectivity is much less of an issue. In step 76, a nearly conformal window layer is deposited such that a thickness in the bottom comer is greater than in the window and sidewall portions 58, 60. Chemical vapor deposition (CVD) may be used for the conformal deposition. No further front side patterning is required. As a result, both the support and window layers 52, 56 can be formed of the same material, for example, silicon nitride or silicon oxide although conformal coatings are more easily achieved with silicon nitride. Then, in steps 38, 40, the window aperture 26 is defined in the backside of the wafer 12. Very high selectivity is required of the silicon etch relative to the window ultra-thin window portions 58 of the window layer 56.

The two windows 10, 50 share the features that the window layer is fixed to and supported on the ribs of the grid and is exposed on both its principal sides in the apertures of the grid. Furthermore, the grid is part of support layer that may be substantially unpatterned away from the window area to provide significant mechanical support.

There are further variations on the structure of the window and its fabrication. For example, the ribs may be composed of a multi-layer structure. In another example, the grid may comprise a major grid with large ribs and lengthy spacing supporting a minor grid with small ribs and small spacing. The large ribs may be thicker and/or wider than the small ribs.

Figure 6:
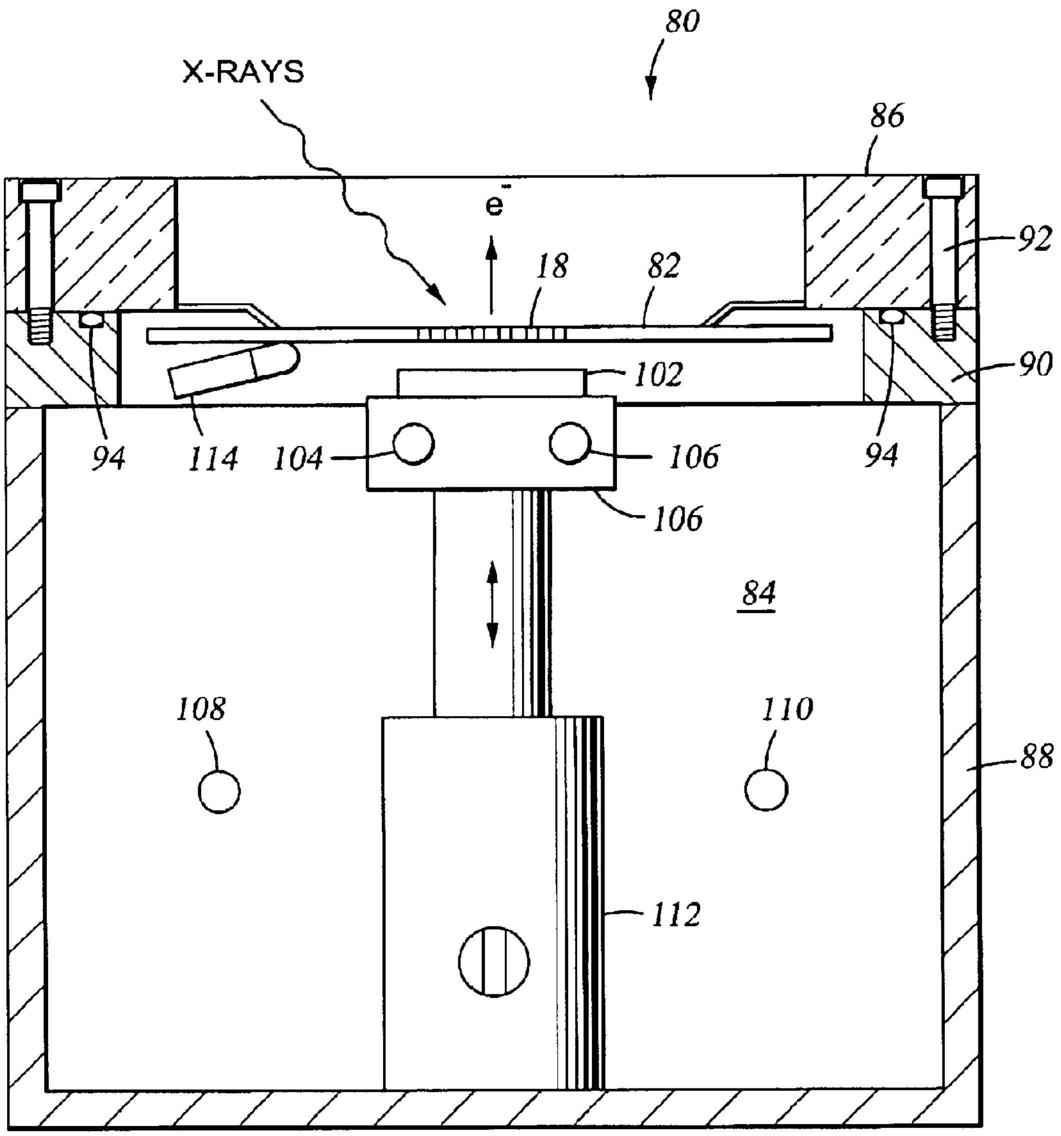
FIG. 6 is a schematic cross-sectional view of a gas cell usable with the electron vacuum window of the invention.

A gas cell 80, schematically illustrated in cross section in FIG. 6 includes an electron vacuum window 82 of the sort previously described separates an interior 84 of the cell 80 from the ultra-high vacuum (UHV) associated with at least the electron detector. The wafer part of the window 82 is bonded to and vacuum sealed to a glass support frame 86, for example, by anodic bonding. The cell includes a cell wall 88 and integral cell frame 90. Screws 92 detachably fix the glass support frame 86 and its attached window 82 to the cell frame 90, and an O-ring 94 provides a vacuum seal between the glass support frame 86 and the cell frame 90. More elaborate fixing and vacuum sealing means are required if the exterior of the cell wall 88 is exposed to UHV.

A sample mounting block 100 supports a sample 102 to be tested in opposition to the window area 18 of the electron vacuum window 82. The mounting block 100 may be temperature controlled by two cool/heat fluid lines 104, 106, and it is preferably movable in the vertical direction by a z-axis stage 112 to allow both easy insertion of the sample 102 while positioning it very close to the window area 18 during probing and to allow scraping of the surface of the sample 102 to expose fresh sample material.

The cell interior 84 may or may not be vacuum pumped relative to the exterior. Indeed, in some applications, it is placed inside the UHV environment of the XPS or AES analyzer but its interior 84 is held at a much higher pressure. In some applications, it is advantageous to control the composition of the cell interior ambient by supplying an environmental gas through an input port 108 and exhausting it through an output port 110. For Martian simulation, the environmental gas would correspond to the Martian atmosphere. In this case, a UV lamp 114 positioned within the cell interior 84 may obliquely irradiate the sample 102 with the UV radiation found on Mars. An auxiliary source of UV or other energetic radiation is also useful in other applications for exciting a surface reaction being monitored. For biological samples, the environment gas would be moist and be held at a few tens of Torr with the mounting block 100 cooling the sample 102 if necessary to below the evaporation temperature of water at that pressure. For gas-phase catalysis, the environment gas would be the gas that reacts with the catalytic material of the sample 82. For CVD studies, the environmental gas would be the CVD precursor gas. Alternatively, a reducing or other cleaning gas may be supplied to maintain a clean sample surface despite a relatively poor vacuum.

Figure 7:
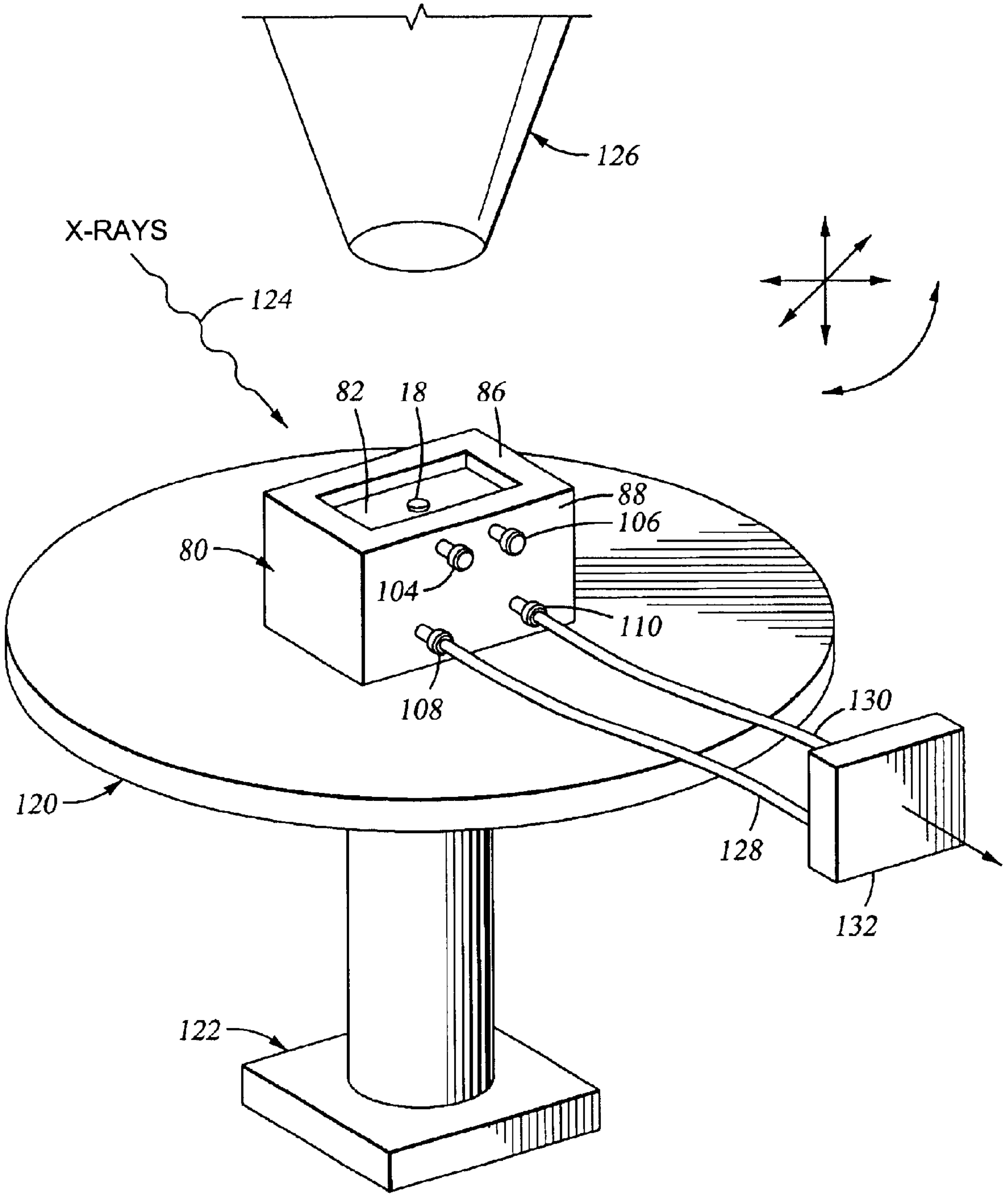
FIG. 7 is a schematic cross-sectional view of a gas cell utilizing an electron vacuum window of the invention disposable within a conventional electron analyzer.

Such a cell 80 may be placed inside a conventional XPS or AES analyzer, as illustrated in the orthographic view of FIG. 7 for an XPS analyzer, to allow the electron analysis of samples the presence of chosen gases at elevated pressures, typically less than 100 Torr but much greater than UHV pressures. A conventional XPS analyzer, such as is available from Surface Science Instruments, contains a sample tray 120 attached to a sample manipulator 122 connected to the floor of the UHV chamber of the analyzer to provide 3-dimensional movement and rotation of the sample tray 120 with respect to an x-ray source 124 and an electron energy analyzer lens 126. An unillustrated sample transfer carousel inserts the gas cell 80 containing the sample through the chamber wall into the UHV chamber and places it on the sample table 120. Gas lines 128, 130 connect the environmental gas ports 104, 106 to a termination box 132 connecting fluid and electrical lines to an external flange of the UHV chamber. For simplicity, the thermal fluid lines are not illustrated. Once the gas cell 80 has been placed on the sample tray 120, the manipulator moves the window area 18 of the electron window 82 into alignment with the x-ray source 124 and the analyzer lens 126 to permit standard XPS operation but with a controlled gaseous environment surrounding the test sample within the gas cell 80. Such a configuration allows conventional XPS and AES analyzers and their attendant peripheral equipment to be adapted for measuring samples in a gaseous environment.

Figure 8:
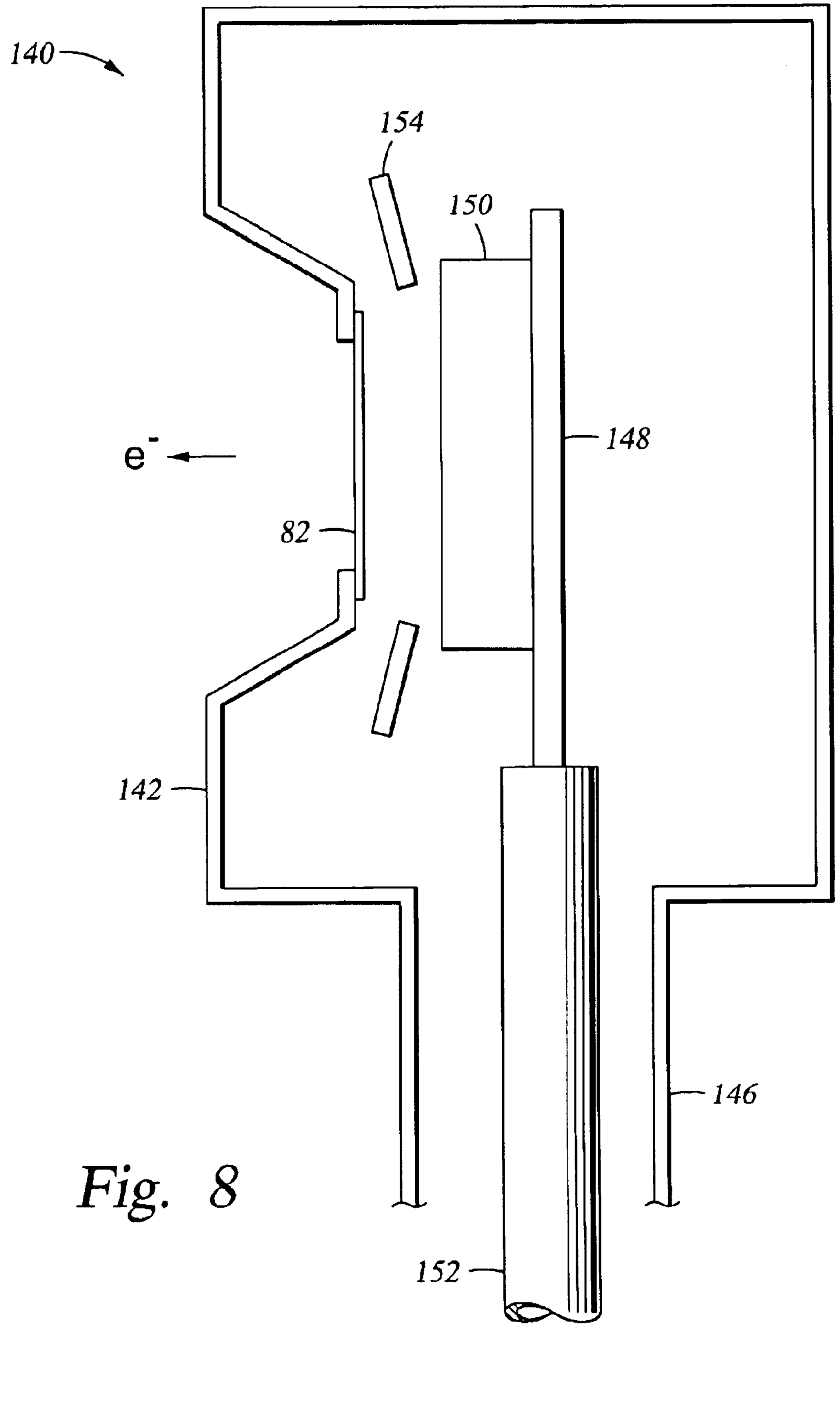
FIG. 8 is a cross-sectional view of a gas cell allowing insertion of a sample into a UHV chamber and a control of the gaseous environment surrounding the sample being tested.

A different configuration, illustrated in the schematic cross-sectional view of FIG. 8, places a stationary sample cell 140 within a UHV chamber of an electron analyzer. The sample cell 140 includes a vacuum-tight enclosure 142 sealed to the electron vacuum window 82, which is directed toward the electron optics of the analyzer. A transfer conduit 146 connects the enclosure 142 through the vacuum wall of the analyzer and accommodates both a sample holder 148 mounting a sample 150 to be tested as well as a manipulator arm 152. Temperature control of the sample 150 may be provided through the sample holder 148 and manipulator arm 152. Advantageously an annular x-ray source 154 is disposed within the enclosure 142 to irradiate the sample 150 during testing. The enclosure 142 and the transfer conduit 146 are vacuum sealed against the UHV of the analyzer and additionally may be filled through the transfer conduit 146 with a selected gaseous environment at a selected pressure higher than UHV. In operation, the manipulator arm 152 withdraws the sample holder 148 from the enclosure 142 to the exterior of the UHV chamber to allow the sample 150 to be mounted on the sample holder 148. The sample holder 148 is then reinserted into the enclosure 142 with the sample 150 in alignment and close proximity to the window area 18 of the electron vacuum window 82. If desired, the end of the transfer conduit 146 is sealed and then filled with the desired gaseous environment at the desired pressure. All the while, the interior of the UHV chamber remains sealed. The lack of UHV interlocks for sample introduction reduces the complexity of the equipment, reduces pump down time, and speeds operation while the controlled gas environment adjacent sample 150 during testing provides new types of chemical analysis of the sample.

Figure 9:
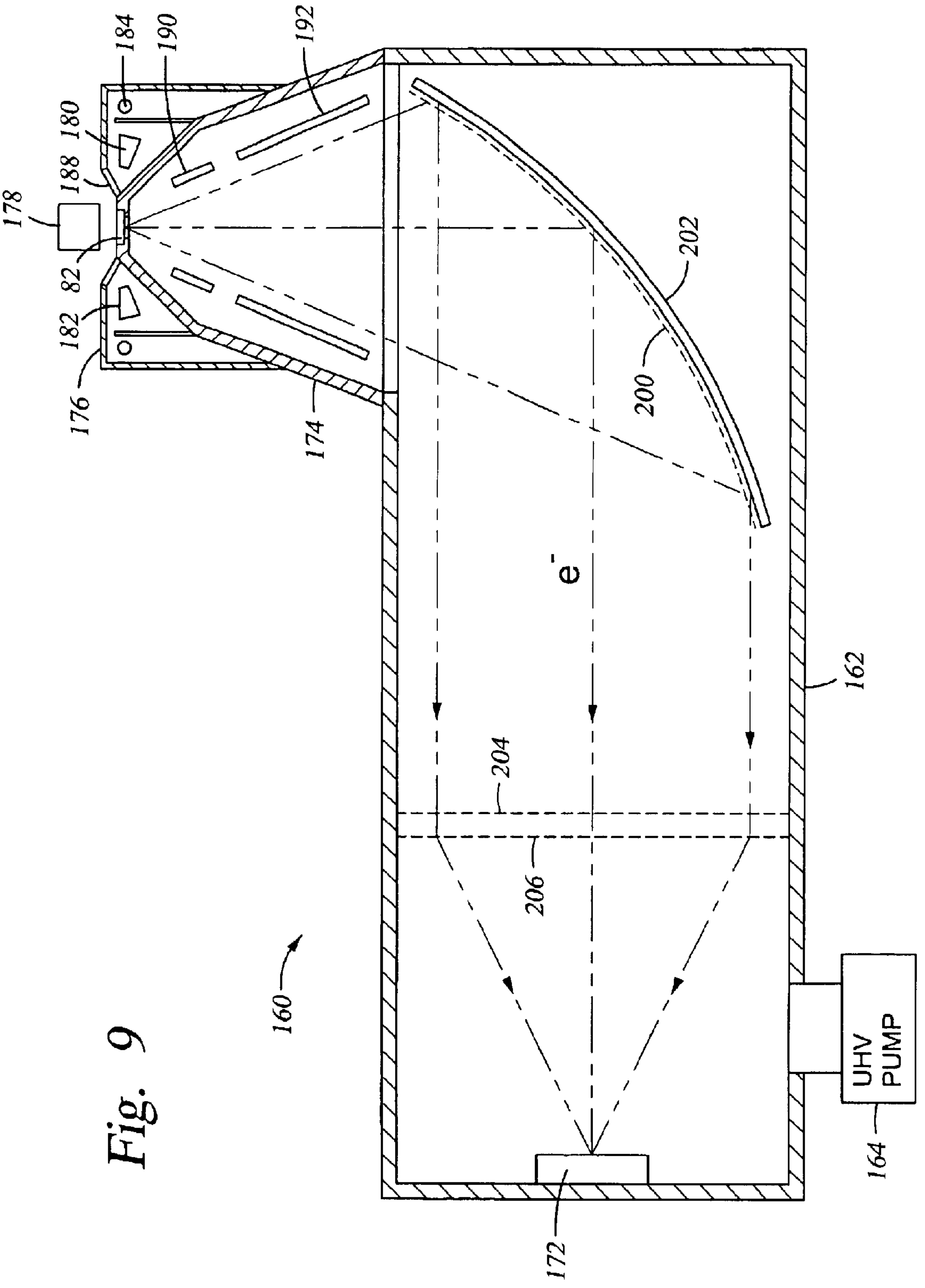
FIG. 9 is a cross-sectional view of a compact XPS analyzer using an electron vacuum window of the invention.
Figure 10:
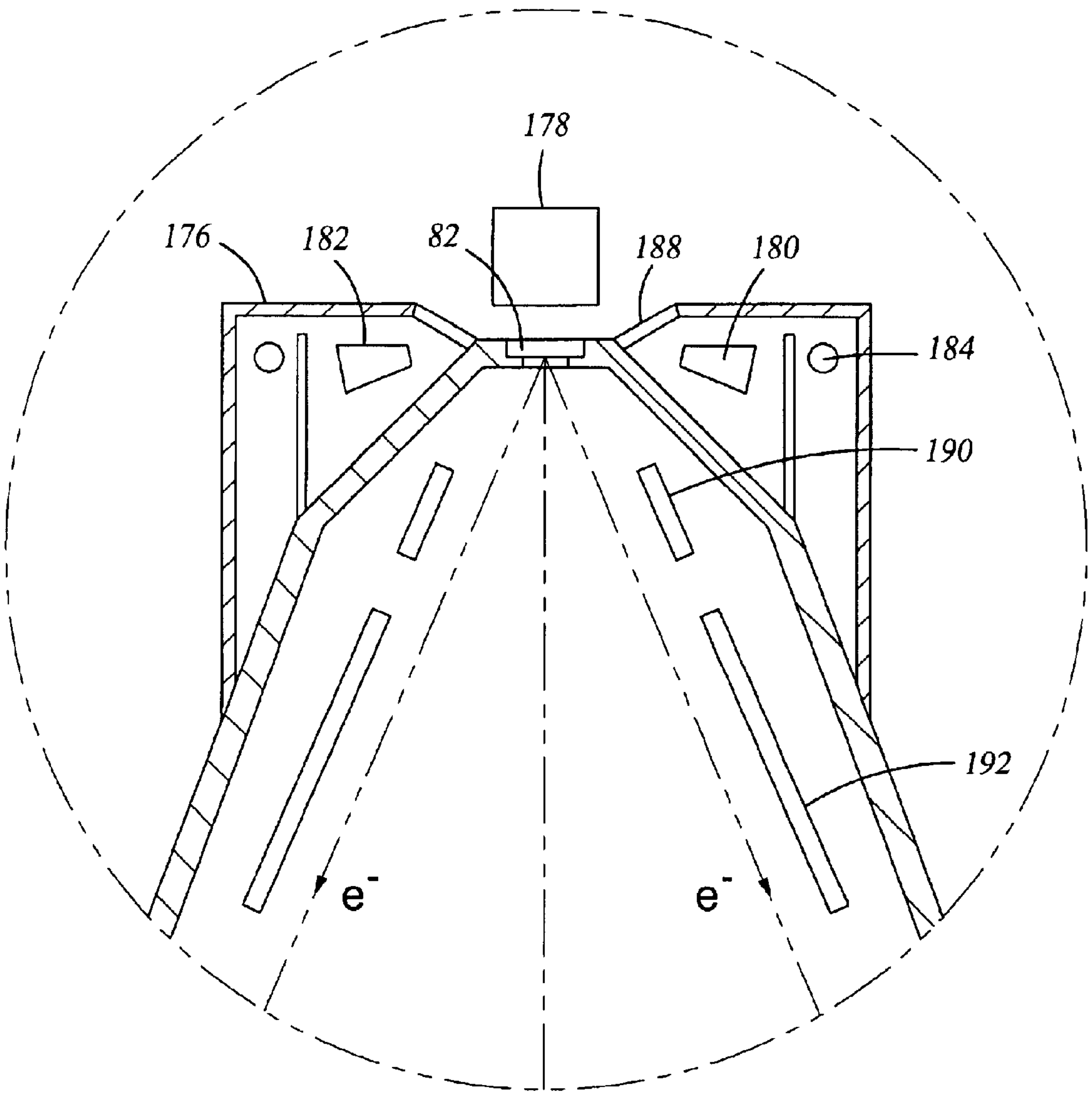
FIG. 10 is an exploded view taken of the window region of the analyzer of FIG. 9.

A compact XPS analyzer 160, illustrated in cross section in FIG. 9, which may advantageously use the electron vacuum window of the invention, has been developed by Michael Kelly and one of the present inventors, Bryson. It includes a tubular main vacuum chamber 162 having a diameter of about 10 cm pumped to UHV pressure by a vacuum pump system 164. An electron detector 172, such as a microchannel plate or photomultiplier tube, is disposed on one end of the tubular chamber 162, and its electrical output measures the intensity or flux of the electrons being detected. A side chamber 174, also illustrated in the exploded view of FIG. 10, extends from a side of the other end of the tubular chamber 162. The ultra-thin electron vacuum window 18 of the invention is included in a face 176 of the side chamber 174 and separates the UHV of the main and side chambers 162, 174 from a sample 178 to be tested, which may be positioned in atmospheric pressure to the requisite distance from the window 18, for example, 2 mm. An annular x-ray source includes an annular target 180 with an oblique face 182 strongly biased with respect to an electron source 184 to attract and accelerate electrons to the oblique face 182 to excite the target 170 to emit x-rays towards portions of the sample 178 facing the window area 18 of the electron vacuum window 82. The x-ray source is positioned around and below the vacuum window 18 and irradiates the sample 178 through another relatively thin window 188 with sufficient transmission for the x-ray wavelength of interest.

The resulting photoelectrons ejected from the sample 18 pass through the window area 18 of the electron vacuum window 82 and enter the UHV of the analyzer. Conically shaped retarder lenses 190, 192 retard the photoelectrons to a lower energy of interest. For example, −900V of bias to the retarder lenses 190, 192 reduces a 1000 eV photoelectron to 100 eV. The photoelectrons strike a shaped grid 200 and absorber 202 that act as a reflective low-pass filter. For example, −100V of bias applied to the absorber 202 relative to the shaped grid 200 reflects any photoelectrons of original energy less than 1000 eV (reduced to 100 eV by the retarder lenses 190, 192 ). Photoelectrons of higher energy pass through the grid 200 and are absorbed by the electron absorber 202. The grid 200 and absorber 202 are shaped approximately parabolically, preferably in two-dimensions, so that the low-energy photoelectrons emanating from the point source on the sample 178 are generally collimated after reflection from the shaped grid 200 and absorber 202 as electrons in the present energy range of less than 100 eV. These photoelectrons then encounter a retarding high-pass filter including a front grid 204 and a rear grid 206. If the rear grid 206 is biased at −99V (1V less magnitude than on the shaped absorber 202), all photoelectrons of energy less than 100 eV are reflected and those between 99 and 100 eV are transmitted but with present energies of 0 to 1 eV. These energies correspond to original energies at the sample 178 of 999 eV to 1000 eV. The electron detector 172 is biased positively with respect to the back grid 206. As a result, the photoelectrons passing through the high-pass filter 204, 206 are attracted to the electron detector 172 and detected there, thus providing the photoelectron spectrum from the sample 178. The various voltages are scanned to provide an energy spectrum of the XPS photoelectrons.

The thin electron vacuum window 82 can be designed to withstand atmospheric pressure against the UHV of the interior of the electron analyzer 160, and the analyzer 160 is small enough to fit within the base of a table-top cabinet. A particularly advantageous configuration puts the face 176 of the side chamber 174 at the table top allowing easy manual positioning of the sample 178 over the window area 18 of the electron vacuum window 82 with an unillustrated set of fingers supporting the sample 178 during testing. Then, a small local enclosure can be placed around the sample 178 and vacuum sealed to the table top with a simple O-ring seal. The enclosure can then be easily pumped down to the Torr range and perhaps backfilled with a selected reactive gas. Such operation offers great economy, efficiency, and flexibility over the standard XPS analyzer requiring insertion of the sample into a UHV chamber.

Although the analyzer 160 was described in the context of an XPS analyzer, relatively small changes convert it to an AES analyzer in which the multi-keV probe electrons are injected through the main electron vacuum window 18 or through a similar window positioned on the side.

The invention thus allows inexpensive, lightweight electron analysis and further provides the capability of electron analysis in controlled gaseous environments. These advantages are enabled by a simple extension of existing technology.

What is claimed is:

1. An electron transmissive window, comprising:

a substrate having a window aperture formed therethrough;

a grid comprising a first material formed of ribs overlying said window aperture; and a window layer comprising a second material having a thickness of between 1 and 5 nm supported on said ribs, extending therebetween, and exposed on a first side to said window aperture and on a second side opposite said window aperture.

2. The window of claim 1, wherein said thickness is between 2 and 3 nm.

3. The window of claim 1, wherein said grid is formed of a support layer having a thickness of between 0.4 and 5 μm.

4. The window of claim 1, wherein window layer contacts said substrate in an area away from said window aperture and said a support layer of which is grid is formed contacts said window layer.

5. The window of claim 1, wherein said grid is exposed to said window aperture.

6. The window of claim 5, wherein said window layer is coated onto sidewalls of said ribs and sides of said ribs opposite said aperture.

7. The window of claim 5, wherein said grid is formed of a support layer contacting said substrate in an area away from said window aperture.

8. The window of claim 1, wherein said first and second materials are chosen from the group consisting of silicon oxide and silicon nitride.

9. The window of claim 8, wherein said first and second materials are a same material.

10. The window of claim 8, wherein said first and second materials are different materials.

11. The window of claim 1, wherein said substrate is a silicon substrate.

12. In an electron analysis system comprising a source of probing radiation for exciting a sample and an electron analyzer disposed within a vacuum chamber held at a pressure of no more than $10^{-6}$ Torr, said sample being disposed outside of said vacuum chamber, a window sealable to said chamber between said sample and said electron analyzer and comprising:

a substrate having a window aperture formed therethrough;

a grid comprising a first material formed of ribs overlying said window aperture and supported in an area of said substrate away from said window aperture; and a window layer comprising a second material having a thickness of between 1 and 5 nm supported on said ribs, extending therebetween, and exposed on a first side to said window aperture and on a second side opposite said window aperture.

13. The window of claim 12, wherein said first and second materials are selected from the group consisting of silicon oxide and silicon nitride.

14. The window of claim 13, wherein said first and second materials are a same material.

15. The window of claim 12, wherein said thickness is between 2 and 3 nm.

16. An electron analysis system, comprising:

a source of probing radiation for exciting a sample to produce electrons;

a vacuum chamber having an interior maintained at a pressure of no more than $10^{-6}$ Torr;

an electron analyzer disposed in said interior of said chamber;

a sample holding position disposed at a position vacuum isolated from said interior of said chamber; and an electron transmissive window sealed to said chamber between said interior and said sample holding position and comprising a substrate having a window aperture formed therethrough, a grid comprising a first material formed of ribs overlying said window aperture, and a window layer comprising a second material having a thickness of between 1 and 5 nm supported on said ribs, extending therebetween, supported in an area of said substrate away from said window aperture, and exposed on a first side to said window aperture and on a second side opposite said window aperture.

17. The system of claim 16, wherein said source of probing radiation is a source of x-rays.

18. The system of claim 17, wherein said source is disposed on a side of said window opposite said interior of said chamber.

19. The system of claim 16, wherein said source of probing radiation is a source of probe electrons disposed in said interior of said chamber and irradiating said probe electrons through said window.

20. The system of claim 16, wherein said substrate is a silicon substrate and said first and second materials are selected from the group consisting of silicon oxide and silicon nitride.

* * * * *